(12) United States Patent
Park et al.

(10) Patent No.: US 6,947,307 B2
(45) Date of Patent: Sep. 20, 2005

(54) PACKAGE MAP DATA OUTPUTTING CIRCUIT OF SEMICONDUCTOR MEMORY DEVICE AND METHOD FOR OUTPUTTING PACKAGE MAP DATA

(75) Inventors: Yong-Dae Park, Yongin (KR); Kwang-Jin Lee, Seoul (KR)

(73) Assignee: Samsung Electronics Co., Ltd., Kyunki-do (KR)

( * ) Notice: Subject to any disclaimer, the term of this patent is extended or adjusted under 35 U.S.C. 154(b) by 0 days.

(21) Appl. No.: 11/030,522

(22) Filed: Jan. 6, 2005

(65) Prior Publication Data
US 2005/0117417 A1    Jun. 2, 2005

Related U.S. Application Data

(62) Division of application No. 10/179,147, filed on Jun. 26, 2002.

(30) Foreign Application Priority Data
Jul. 13, 2001  (KR) ................................ 2001-42330

(51) Int. Cl.$^7$ ............................................... G11C 5/06
(52) U.S. Cl. ........................ 365/63; 365/240; 365/201
(58) Field of Search .......................... 365/63, 240, 201

(56) References Cited

U.S. PATENT DOCUMENTS

5,829,007 A * 10/1998 Wise et al. ............. 365/189.04
6,804,135 B1 * 10/2004 Srinivasan et al. ........... 365/49

* cited by examiner

Primary Examiner—Anh Phung
Assistant Examiner—Tuan T. Nguyen
(74) Attorney, Agent, or Firm—F. Chau & Associates, LLC

(57) ABSTRACT

A package map data outputting circuit of a semiconductor memory device embedded with a test circuit and a method for the same. In order to improve the reliability of package map data and easily output a greater amount of package map data, package map data is stored to package map data registers at the wafer level and then output through the test circuit at the package level.

8 Claims, 5 Drawing Sheets

PACKAGE MAP DATA OUTPUTTING CIRCUIT OF SEMICONDUCTOR MEMORY DEVICE AND METHOD FOR OUTPUTTING PACKAGE MAP DATA

CROSS-REFERENCE TO RELATED APPLICATION

This application is a divisional of U.S. patent application Ser. No. 10/179,147 filed on Jun. 26, 2002, which is incorporated herein by reference and which claims foreign priority under 35 U.S.C. § 119 to Korean Application No. 2001-42330, filed on Jul. 13, 2001.

TECHNICAL FIELD OF THE INVENTION

The present invention generally relates to an application data output of a semiconductor memory device, and more particularly, to a circuit and method for outputting package map data of a semiconductor memory device at a package level.

BACKGROUND

Semiconductor memory devices require high productivity and high quality to obtain market competitiveness. Consequently, methods for improving product quality and productivity are continuously being developed. One proposed method for improving the quality of the semiconductor memory device is analyzing a wafer to determine causes of problems at the wafer level.

A variety of data on semiconductor products are generally stored at the wafer level as "package map data". More specifically, package map data such as a production date and position data in the wafer are stored at the wafer level by using fuse elements, thereby enabling easy analysis of the data at the package level. The stored package map data is generally output through an input pad in the semiconductor device. The number of input pads to be exposed at the package level for a given product is fixed. Thus, it is very difficult to additionally assign a large amount of package pins to output the package map data stored in the semiconductor memory chip. Indeed, because of the difficulty in arranging package pins, it is preferable to minimize the number of package pins that are not related to operation of the semiconductor memory.

FIG. 1 is a conventional circuit for storing and outputting package map data. Referring to FIG. 1, a plurality of N-type MOS transistors N1–N6 are connected in series between a power pin POWER1 and a pad PAD1, and a plurality of fuses F1–F4 are connected to node N01. With the circuit of FIG. 1, it is possible to input data for the following 5 cases: no fuses are cut; the fuse F1 is cut; the fuses F1, F2 are cut; the fuses F1, F2, F3 are cut; or the fuses F1, F2, F3, F4 are cut. That is, data can be input to the pad PAD1 with either of the aforementioned 5 different cases. As a result, if the number of input pads are n (where, n is an integer), it is possible to store n squares of 5 data.

Operations of the circuit shown in FIG. 1 is described below. During a normal operation mode, electric current does not flow because the voltage level of the power pin POWER1 is higher than that of the pad PAD1. During a test operation mode for checking the data stored (via the cutting fuses), 0 volt is applied to the power pin POWER1 and voltage is applied to the pad PAD1, which voltage is greater than the number of transistors multiplied by threshold voltage. Then, depending on which fuses were cut, a given amount of electric current will flow depending on the number of transistors connected in series. Therefore, it is possible to check the stored package map data by measuring the amount of electric current. At this time, the levels of electric current flowing in each of the transistors is different because of, e.g., differences in transistor characteristic depending on voltages and temperature. Therefore, even if various package products have the same map data, because of differences in the current, the stored data may be incorrectly decoded.

As described above, conventional analog methods for decoding the package map data can result in erroneous data interpretation. Further, conventional methods do not allow a large amount of data to be stored through corresponding pads when the package map data are stored at the wafer level. Moreover, it has proven to be difficult to interpret data when the data is stored by using tetrad data or more data.

SUMMARY OF THE INVENTION

It is an object of the present invention to solve the aforementioned problems by providing a circuit and method for outputting package map data of a semiconductor memory device.

It is another object of the present invention to provide a circuit and method that can enable accurate data interpretation by improving the reliability in outputting package map data at the package level.

It is still another object of the present invention to provide a circuit and method for storing and outputting a greater amount of package map data than what is capable using prior art techniques.

In order to accomplish the aforementioned objects, in accordance with one aspect of the present invention, a method for outputting package map data from a semiconductor memory device embedded with a test circuit comprises storing package map data to a package map data register at the wafer level and outputting the package map data through the test circuit at the package level. Preferably, the test circuit is based on a JTAG (Joint Test Action Group) standard.

In accordance with another aspect of the present invention, a semiconductor memory device comprising a circuit for outputting package map data is provided, the circuit comprises a package map data register for storing package map data at the wafer level and a plurality of serially connected JTAG ID registers, wherein each JTAG ID register comprises a first terminal for receiving JTAG ID data, a second terminal for receiving package map data, a test data input terminal for receiving test data, a data output terminal, and first and second selection terminals for receiving first and second selection signals, respectively, wherein each JTAG ID register will select for input the package map data or the JTAG ID register data in response to the first selection signal, and wherein each JTAG ID register will select for output either the selected package map data or selected JTAG ID register data or test data in response to the second selection signal.

A circuit and method for outputting package map data according to the invention advantageously improves the reliability in decoding package map data, and allows a greater amount of package map data to be output without having to increase the number of package pins.

These and other aspects, features, and advantages of the present invention will be described and become apparent by the detailed description of preferred embodiments, which is to be read in connection with the accompanying figures.

DETAILED DESCRIPTION OF PREFERRED EMBODIMENTS

Figure 1:
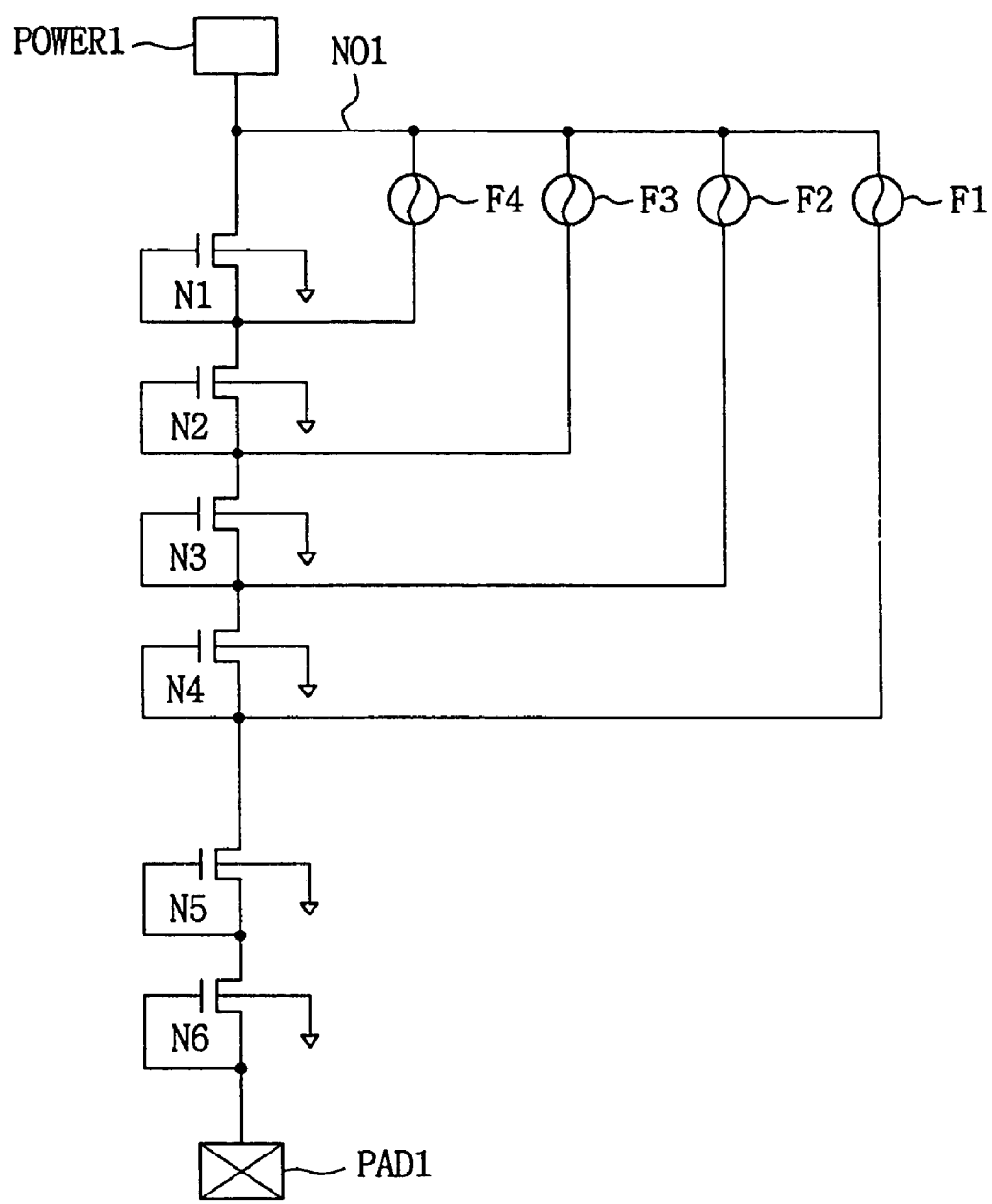
FIG. 1 is a conventional circuit for storing package map data.

Preferred embodiments of the present invention will now be described in detail with reference to the accompanying drawings, where like reference numerals and symbols are used to denote like or equivalent parts or portions. For simplicity of illustration and explanation, detailed descriptions of known features and functions will be omitted.

In a preferred embodiment of the present invention, package map data is output through a test circuit that is based on the JTAG (Joint Group Action Group) framework. The package map data is output using a JTAG framework that is adapted to a ball grid array (BGA) type package of a semiconductor memory chip such as a static random access memory (SRAM) having ball pins as package pins. In addition, the package map data is preferably stored as binary data using package map registers. The amount of data stored is determined according to the number of data latches of the package map data register. As a result, a desired quantity of a digital data can be stored by adding data latches.

The JTAG standard, which has been widely adapted in the related field, is defined in IEEE 1149.1, IEEE standard test access port and boundary scan architecture. A JTAG logic is adapted to a semiconductor memory chip (e.g., a static random access memory) using a BGA (ball grid array) package for testing a chip. In the current SRAM, a shift register is placed between a device pin and inner logic, to determine whether each pin is short and open when a boundary scan test is performed for the device. Even if all the requirements for the JTAG IEEE 1149.1 standard are satisfied in the SRAM, there may be problems such as signal delay and overhead of a chip size. A test circuit such as the JTAG logic is operated at a particular operational node, for instance, a test mode, where the semiconductor memory chip is not in normal operation. The JTAG logic may be constructed with a boundary scan register block having a plurality of boundary scan registers, bypass register, ID register, command register and test access port (TAP) controller. The TAP controller receives a selected test mode and a test clock with respective input terminals TMS, TCK and outputs timing control signals. Series data is input to a test data input terminal TDI connected with inputs of the registers. The series data is usually sampled at a rising edge of the test clock and applied to the command register or data register according to a test command mode.

Figure 2:
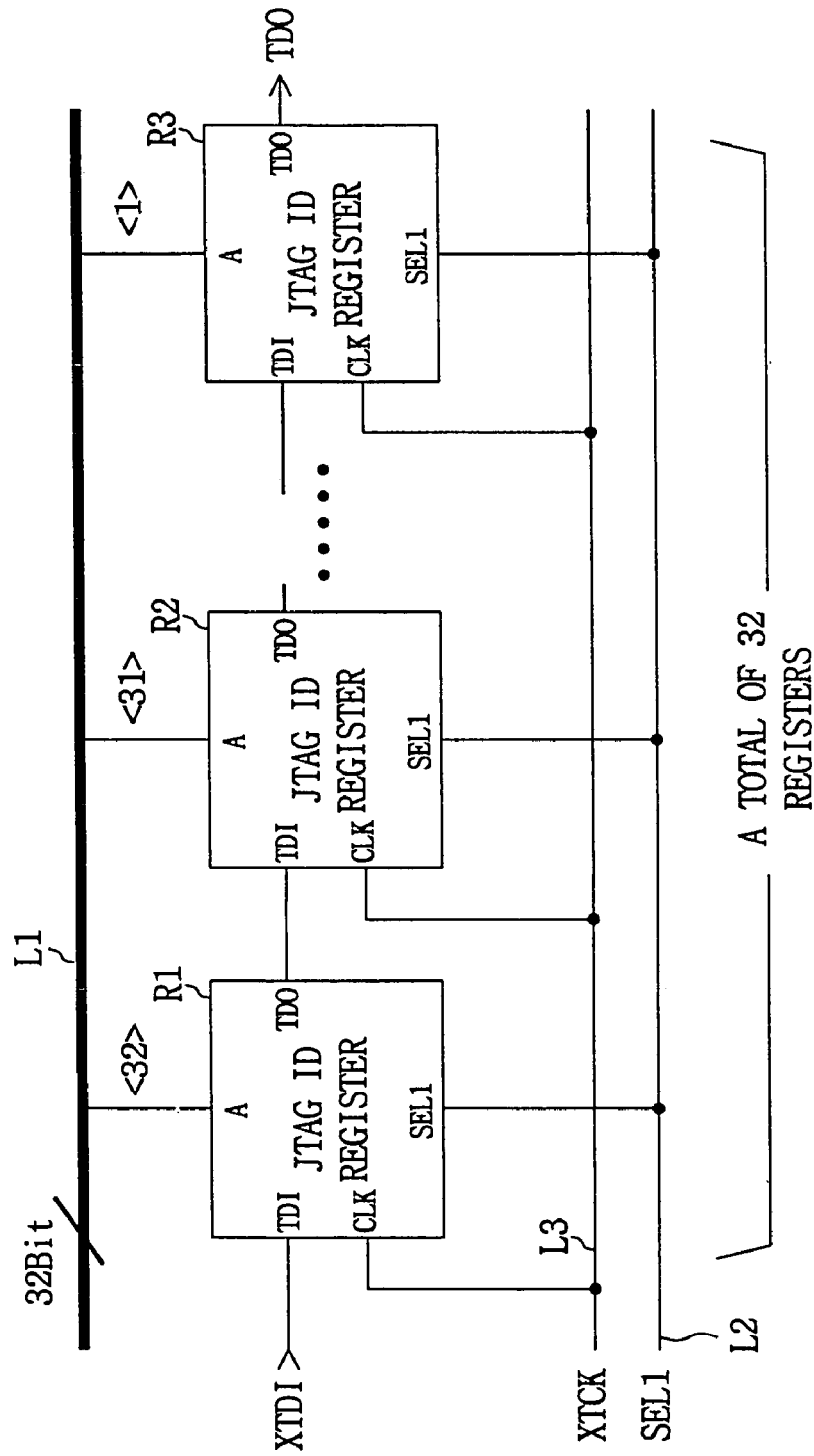
FIG. 2 is a schematic diagram illustrating conventional JTAG ID registers.

FIG. 2 is a schematic diagram illustrating a framework of JTAG ID registers in a JTAG circuit adapted to a semiconductor memory device. As shown in FIG. 2, JTAG ID registers R1, R2, R3 are connected in series, and a 32 bit data bus line L1 is connected to input terminals A of each register for inputting 1 bit ID data in parallel to respective JTAG ID registers. A test clock XTCK is provided to respective clock (CLK) terminals of the JTAG ID registers R1, R2, R3. As selection signal SEL1 is applied to respective selection terminals SEL1 of the JTAG ID registers R1, R2, R3. When a JTAG instruction code, for instance, "001" is provided, the ID code instruction operations will be performed. During the operations, the data defined at the ID register definition is output in series through the TDO pin.

Figure 3:
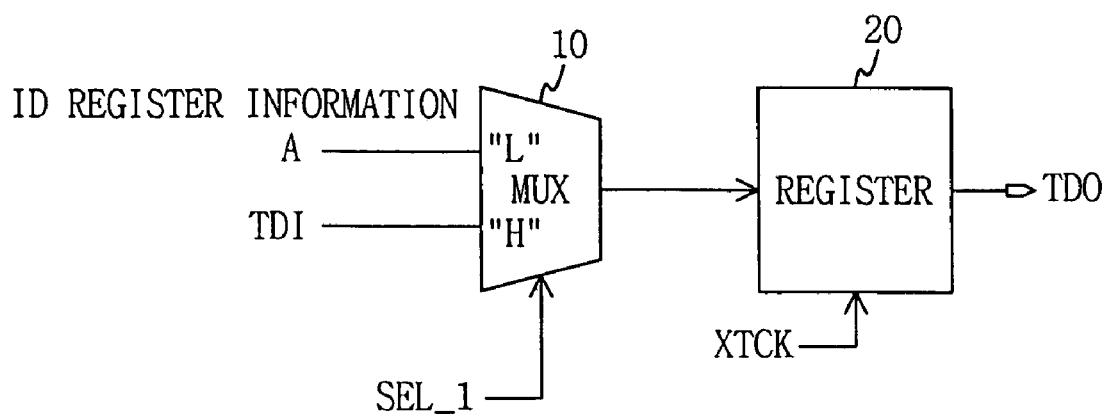
FIG. 3 is a perspective block diagram of the registers shown in FIG. 1.

FIG. 3 is a schematic diagram illustrating a JTAG ID register in a JTAG ID register block. As shown in FIG. 3, the JTAG ID register includes a multiplexer 10 to output ID register data received via input terminal A and TDI data received with a test data input terminal TDI and a register 20 to output the output of the multiplexer 10 in response to a test clock TCK. Operations of the JTAG ID register of FIG. 3 will be described below. If selection signal SEL 1 for outputting JTAG data of the input terminal TDI is input having logic level of "H" while ID register data is received in parallel, the data of the input terminal A is not selected, but the data of the TDI is selected to output to the register 20. The register 20 outputs the TDI data through an output terminal TDO synchronized with the test clock TCK. The entire operations of FIG. 2 are continuously performed by the operations of FIG. 3 as the data output from JTAG ID register R1 is transmitted as an input of the following JTAG ID register R2. Such continuous operations are made according to the diagram for illustrating the states of TAP controller as defined in IEEE 1149.1. This is because selection signal changes state "L" into "H" if a TAP controller turns a capture DR state into a shift DR state.

If the selection signal SELL is at state "L", ID data is stored at registers. Or, if the selection signal SELL is at a state "H", the ID data stored in synchronization with a clock TCK is continuously output through the output terminal TDO.

Figure 4:
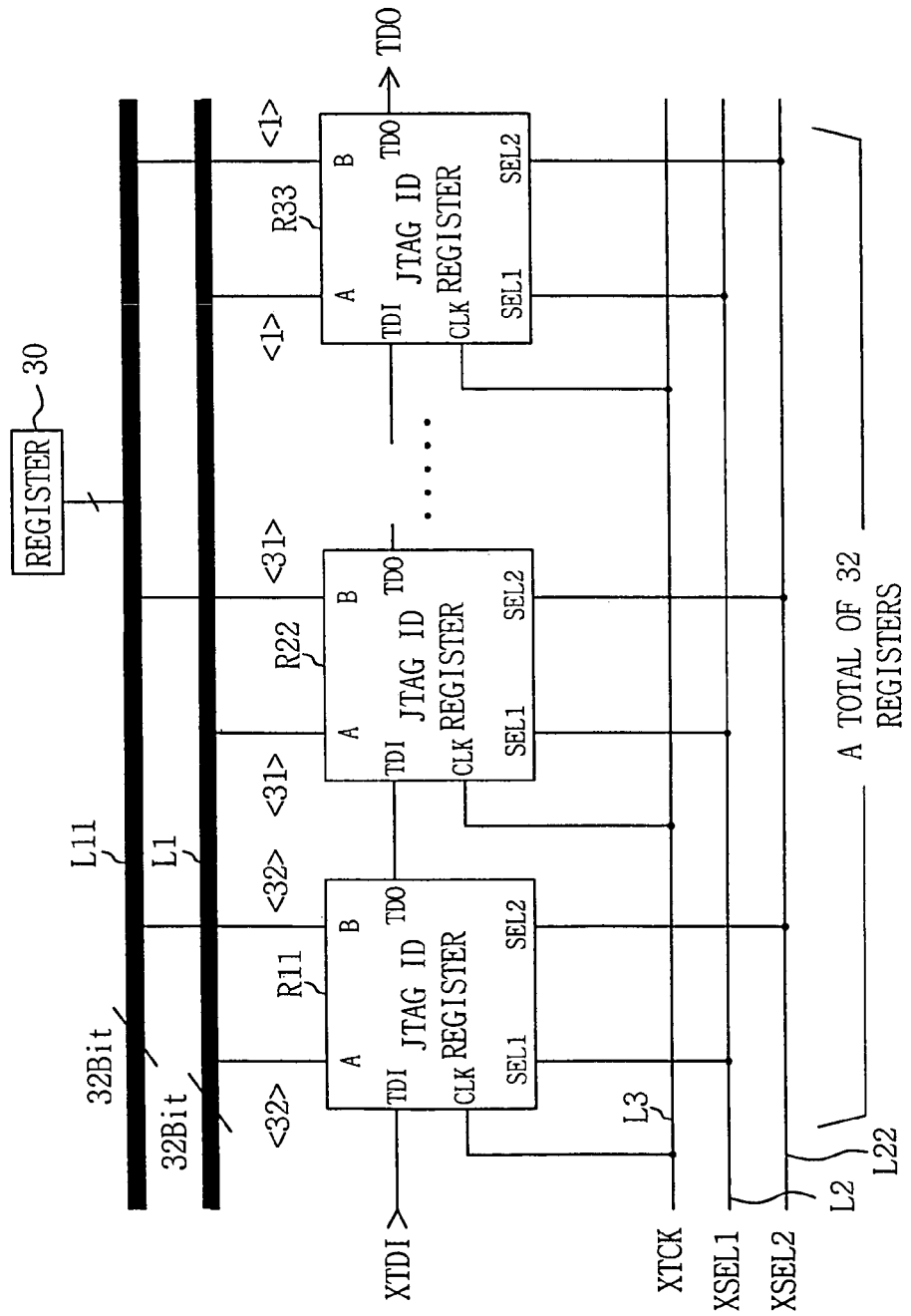
FIG. 4 is a schematic diagram illustrating a circuit for storing package map data using Joint Test Action Group (JTAG) ID registers in accordance with an embodiment of the present invention.

FIG. 4 is a circuit for outputting package map data according to an embodiment of the present invention. An output circuit according to the present invention is preferably based on the JTAG framework, wherein package map data is output using a JTAG framework constructed in a BGA package type.

Referring to FIG. 4, the package map data outputting circuit comprises a package map data storing register 30 and a plurality of JTAG ID registers R11, R22, R33. Preferably, the plurality of JTAG ID registers R11, R22, R33 comprise 32 JTAG ID registers connected in series. The package map data storing register 30 stores the package map data at the wafer level and is connected to a first data bus line L11 for transferring the package map data to the plurality of JTAG ID registers R11, R22, R33.

Each JTAG ID register R11, R22, R33 comprises a first input terminal A for receiving JTAG ID register data, a second input terminal B for receiving package map data, a test data input terminal TDI for receiving test data XTDI, a data output terminal TDO, first and second selection terminals SEL1, SEL2 for receiving a first selection signal XSEL1 from a third data bus line L2 and a second selection signal XSEL2 from a fourth data bus line L22, and a clock terminal CLK for receiving a clock signal XTCK from a fifth data bus line L3.

The respective JTAG ID registers R11, R22, R33 selectively output either package map data received from the first data bus line L11 or the JTAG ID register data received from a second data bus line L1 in response to first selection signal XSEL1. Further, the JTAG ID registers R11, R22, R33 selectively output either the data selected from the first selection terminal SELL or the test data, in response to the second selection signal SEL2.

Figure 5:
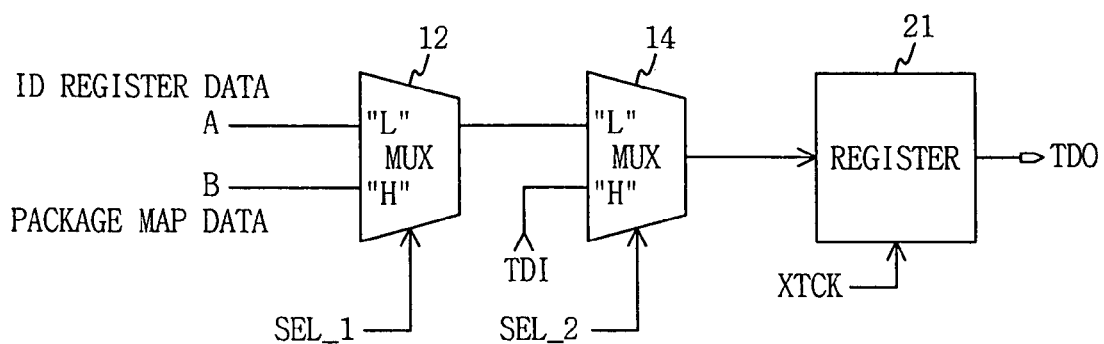
FIG. 5 is a block diagram of the JTAG ID registers shown in FIG. 4.

FIG. 5 is a block diagram of a JTAG ID register shown in FIG. 4. A JTAG ID register according to an embodiment of the present invention comprises a first multiplexer 12, a second multiplexer 14, and a register 21. The first multiplexer 12 receives JTAG ID register data through the first terminal A and package map data through the second terminal B and outputs either the package map data or the JTAG ID register data in accordance with the first selection signal XSEL1 received through the first selection terminal SEL1. The second multiplexer 14 receives the selected data from the first multiplexer 12 and the test data XTDI, and outputs either the selected data from the first multiplexer 12 or the test data XTDI in accordance with the second selection signal XSEL2 of the second selection terminal SEL2. The register 21 receives the selected data from the second multiplexer 14 and outputs the selected data from the second multiplexer 14 to the data output terminal TDO in response to the clock signal XTCK received through the clock terminal CLK.

Figure 6:
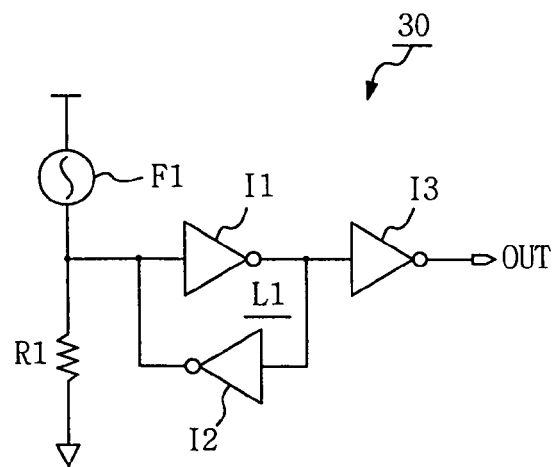
FIG. 6 is a circuit diagram illustrating registers to store package map data shown in FIG. 4.

FIG. 6 is a circuit diagram illustrating an embodiment of the register 30 (FIG. 4) to store the package map data. The register 30 comprises a fuse F1, a resistor R1, a latch L1 comprising inverters I1, I2, and an output inverter I3. The fuse F1 is connected to the resister R1. One terminal of the latch L1 is connected between the fuse F1 and the resistor R1 and the other terminal of the latch L1 is connected to the inverter I3. The inverter I3 is connected to an output terminal OUT which is connected to the first data line L11 (FIG. 4). The stored data output from the output terminal OUT has a logic level of "low" or "high" depending upon whether the fuse F1 is cut. According to an embodiment of the present invention, the package map data storing register 30 can include a plurality of latches and a plurality of fuses, and the plurality of latches are programmed by cutting the plurality of fuses. Advantageously, the package map data storing register 30 can easily store binary data by cutting the plurality of fuses and consequently the reliability for interpretation of data is improved. Furthermore, if the capacity of the package map data storing register 30 is increased and one or more additional multiplexers are added to the JTAG ID register, the data storing capacity of a semiconductor memory device can be increased.

According to an embodiment of the present invention, package map data is stored at a wafer level as binary data in the package map storing register 30. The package map data includes a production date, position information, etc., in the wafer. The package map data is stored as digital data, e.g., by cutting the fuse F1 connected to the latch L1 with a laser beam or other cutting means.

Further, command data IR2, IR1, IR0, such as 1, 1, 0, define new commands that can be applied to the test data input terminal TDI. In other words, the new test data 1, 1, 0 can be applied to the test data input terminal TDI for outputting package map data through the data output terminal TDO. Therefore, in accordance with the invention, the JTAG ID registers R11, R22, R33 are extended to include a new mode of operation, that is, a package map data outputting mode, which is not a JTAG test mode. Since test data 1, 1, 0 are no longer used as input codes in the current JTAG framework, such codes are used to designate a user mode to access package map data. It is to be appreciated that other undefined codes can be used to designate a package map data output mode.

In a package map data output mode, the JTAG ID registers R11, R22, R33 output a logic level of "high" or "low" for the package map data and the JTAG ID register data in accordance with the first and second selection signals XSEL1 and XSEL2. Accordingly, the first multiplexer 12 of the JTAG ID registers R11, R22, R33 selects the package map data and then applies it to the second multiplexer 14. The second multiplexer 14 of the JTAG ID registers R11, R22, R33 respectively outputs the applied package map data to register 21. The register 21 outputs the output of the second multiplexer through data output terminal TDO in response to respective clock signals XTCK. Therefore, package map data is serially output from the data output terminal TDO.

As described above, a circuit for outputting package map data of the present invention outputs JTAG ID register data to the data output terminal TDO when the circuit of FIG. 4 is operated in a JTAG ID register data output mode. While a package map data outputting circuit of the present invention is operated in a package map data output mode, package map data applied from line L11 is output at the package level to the data output terminal TDO. According to an embodiment of the present invention, the data output terminal TDO is a package pin previously assigned for testing operations. Therefore, a large amount of package map data can be output from a semiconductor device without having to increase of the number of package pins, and the package map data can be reliably output.

It is to be understood that notwithstanding that the embodiments described herein are based on a JTAG framework, the present invention can be incorporated with other test logic frameworks for semiconductor memory devices.

Although illustrative embodiments of the present invention have been described with reference to the accompanying drawings, it is to be understood that the invention is not limited to those precise embodiments, and various other changes and modifications may be effected therein by one skilled in the art without departing from the scope or spirit of the invention as defined in the appended claims.

What is claimed is:

1. A semiconductor memory device comprising a circuit for outputting package map data, the circuit comprising:
   a package map data register for storing package map data at the wafer level; and
   a plurality of serially connected JTAG ID registers, wherein each JTAG ID register comprises a first terminal for receiving JTAG ID data, a second terminal for receiving package map data, a test data input terminal for receiving test data, a data output terminal, and first and second selection terminals for receiving first and second selection signals, respectively,
   wherein each JTAG ID register will select for input the package map data or the JTAG ID register data in response to the first selection signal, and wherein each JTAG ID register will select for output either the selected package map data or selected JTAG ID register data or test data in response to the second selection signal.

2. The circuit of claim 1, wherein the plurality of JTAG ID registers comprise 32 JTAG ID registers.

3. The circuit of claim 1, wherein the package map data register comprises a latch.

4. The circuit of claim 3, wherein the package map data register further comprises a fuse, a resister, and an inverter, wherein the fuse is connected to the resister and the latch is connected between the inverter and a node between the fuse and the resister.

5. The circuit of claim 1, wherein the package map data register comprises a plurality of fuses and a plurality of latches.

6. The circuit of claim 5, wherein the plurality of latches are programmed by cutting the fuses.

7. The circuit of claim 1, wherein the package map data register is connected with the plurality of JTAG ID registers through a 32 bit data bus line.

8. The circuit of claim 1, wherein each JTAG ID register comprises:

a first multiplexer for selecting the package map data or the JTAG ID register data, in response to the first selection signal;

a second multiplexer for selecting the data selected by the first multiplexer or the test data, in response to the second selection signal; and a register for storing and outputting the data selected by the second multiplexer, in response to a clock signal.

* * * * *